(12) United States Patent
Ellis et al.

(10) Patent No.: US 8,411,062 B1
(45) Date of Patent: Apr. 2, 2013

(54) ADAPTIVE DRIVE SYSTEM

(75) Inventors: Denis Ellis, Cobh (IE); Daniel O'Keeffe, Whitechurch (IE); Maksym Prybytko, Cork (IE)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 13/599,167

(22) Filed: Aug. 30, 2012

Related U.S. Application Data

(60) Provisional application No. 61/610,761, filed on Mar. 14, 2012.

(51) Int. Cl.
*G06F 3/041* (2006.01)
(52) U.S. Cl. ..... 345/173; 345/156; 345/174; 178/18.01; 178/18.07; 178/18.05; 178/18.06
(58) Field of Classification Search .......... 345/156–184; 178/18.01–19.07
See application file for complete search history.

(56) References Cited

U.S. PATENT DOCUMENTS

| 5,646,809 | A | 7/1997 | Motley | |
|---|---|---|---|---|
| 2005/0206585 | A1 | 9/2005 | Stewart | |
| 2008/0165139 | A1 | 7/2008 | Hotelling | |
| 2008/0309622 | A1* | 12/2008 | Krah | 345/173 |
| 2009/0002312 | A1* | 1/2009 | Son | 345/104 |
| 2009/0009483 | A1 | 1/2009 | Hotelling | |
| 2011/0102061 | A1 | 5/2011 | Wang | |
| 2011/0242048 | A1 | 10/2011 | Guedon | |
| 2011/0310051 | A1 | 12/2011 | Souchkov | |
| 2012/0092297 | A1 | 4/2012 | Han | |
| 2012/0256870 | A1* | 10/2012 | Klein et al. | 345/174 |
| 2012/0306801 | A1* | 12/2012 | Rai et al. | 345/174 |

OTHER PUBLICATIONS

Tong-Hun Hwang; A Highly Area-Efficient Controller for Capacitive Touch Screen Panel Systems; IEEE Transactions on Consumer Electronics, vol. 56, Issue 2; May 2012; (Abstract) pp. 1115-1122; http://ieeexplore.ieee.org/xpl/articleDetails.jsp?arnumber=5506047.
Ik-Seok Yang; A Touch Controller Differential Sensing Method for On-Cell Capacitive Touch Screen Panel Systems; IEEE Transactions on Consumer Electronics; vol. 57, Issue 3; Aug. 2011 (Abstract) pp. 1027-1032; http://ieeexplore.ieee.org/xpl/articleDetails.jsp?arnumber=6018851.
S> Pietri et al.; A Fully Integrated Touch Screen Controller Based on 12b 825kS SAR ADC; Argentine School of Micro-Nanoelectronics, Technology and Applications, 2009, EAMTA 2009.
Maxim Product Sheet; MAX11871 TINI® Touch-Screen Controller SoC for Mutual Projected Capacitive Touch; Document Ref. 19-6817 Rev. 0,; Page last modified Dec. 21, 2011; 2 Pages; http://www.maxim-ic.com/datasheet/index.mvp/id/7203.
ATMEL White Paper; Maximizing Touchscreen Performance by Pairing Powerful Circuitry with Intelligent Software; online download Jul. 25, 2012; http://www.atmel.com/Images/maXTouch_S_Series_whitepaper.pdf; 7 Pages.

* cited by examiner

*Primary Examiner* — Lun-Yi Lao
*Assistant Examiner* — Priyank Shah

(57) ABSTRACT

An apparatus includes a down pump configured to generate a regulated voltage signal based, at least in part, on an input voltage and a reference voltage. The apparatus includes a level shifter configured to generate an activation signal having a voltage level corresponding to the reference voltage based, at least in part, on the input voltage and the regulated voltage signal. The apparatus includes a switching device configured to generate a drive signal corresponding to the input voltage in response to the activation signal.

20 Claims, 7 Drawing Sheets

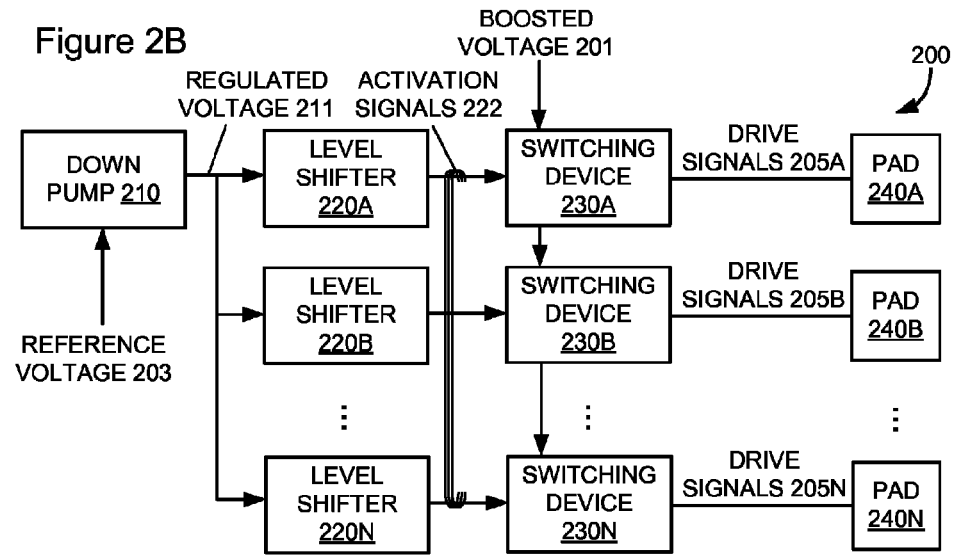
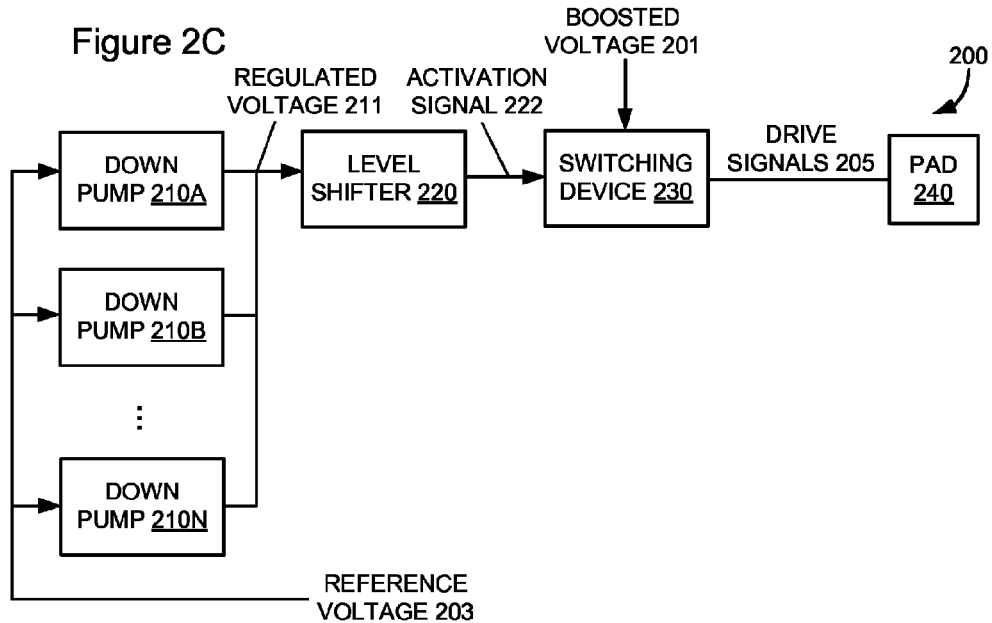

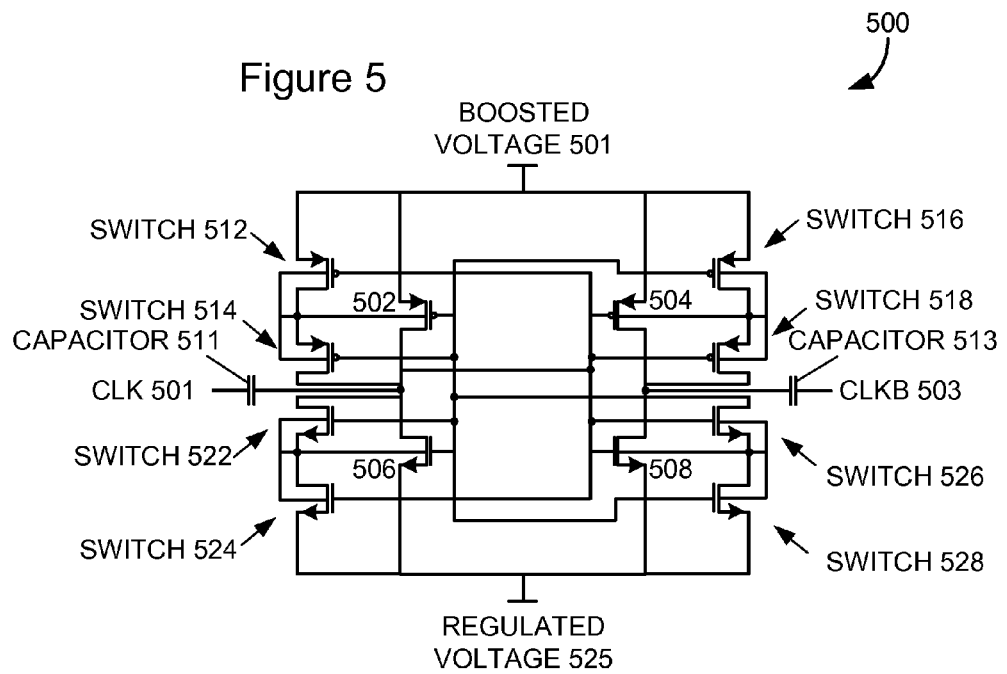

ADAPTIVE DRIVE SYSTEM

RELATED APPLICATION

This application claims priority to U.S. Provisional Patent Application No. 61/610,761, filed Mar. 14, 2012, which is incorporated herein by reference.

TECHNICAL FIELD

This disclosure relates generally to electronic systems, and, more particularly, to adaptive drive systems.

BACKGROUND

Many systems can receive an input supply voltage from a power supply, for example, to power electronic circuits or devices in the systems. Since some of these systems can include electronic circuits or devices, such as touch screen displays, which perform operations in response to signals with a voltage level that differs from that of the input supply voltage, the systems can include charge pumps or other voltage altering device to boost or lower the voltage level of the input supply voltage.

The charge pumps can provide a boosted voltage signal to a drive system, which can selectively provide the boosted voltage signal as a drive signal for a load, for example, a touch screen display. The drive system typically includes multiple series switches to selectively provide the drive signal to the touch screen display, for example, to alter between providing the boosted voltage signal to the touch screen display and receiving touch detection signaling from the touch screen display. These multiple series switches, however, introduce a path resistance, which lowers the voltage level and current of the drive signal. The lower voltage level of the drive signal can reduce a signal-to-noise ratio (SNR) of touch detection signaling received from the touch screen display, making it more difficult to detect touches on the touch screen display. The lower current level of the drive signal can affect performance of the touch screen panel, for example, by slowing response time.

DESCRIPTION OF THE DRAWINGS

FIGS. 2A-2C are block diagrams illustrating example configurations of the drive system shown in FIG. 1.

FIG. 5 is a block diagram illustrating another example of down pump for the drive system shown in FIG. 4.

DETAILED DESCRIPTION

An electronic system can include drive system having a switching device configured to generate a drive signal corresponding to an input voltage in response to an activation signal generated by other circuitry in the drive system. For example, the drive system can include a down pump configured to generate a regulated voltage signal based, at least in part, on the input voltage and a reference voltage. The drive system can include a level shifter configured to generate the activation signal having a voltage level corresponding to the reference voltage based, at least in part, on the input voltage and the regulated voltage signal. Embodiments are shown and described below in greater detail.

Figure 1:
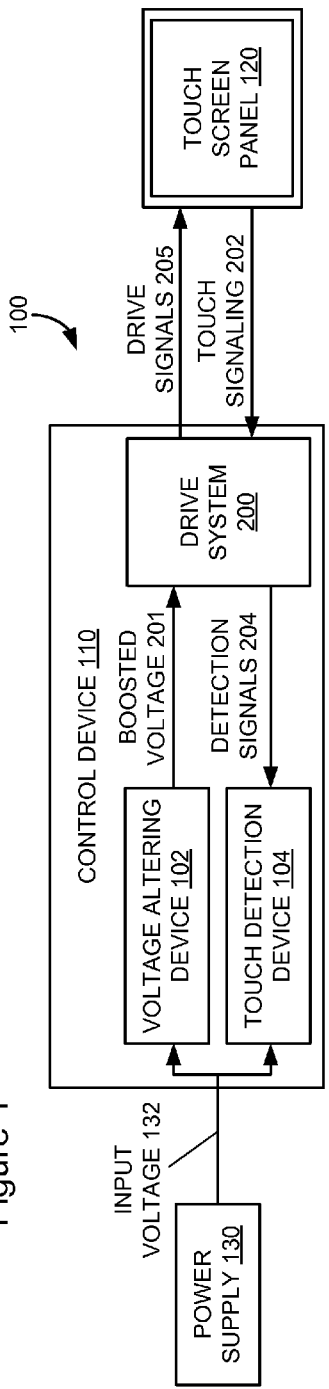
FIG. 1 is a block diagram example of a touch screen interface system including a drive system.

FIG. 1 is a block diagram example of a touch screen interface system 100 including a drive system 200. Referring to FIG. 1, the touch screen interface system 100 can include a control device 110 to control sensing operations associated with a touch screen panel 120. The control device 110 can include a voltage altering device 102 to receive an input voltage 132 from a power supply 130, and boost or otherwise alter a voltage level of the input voltage 132 to generate a boosted voltage 201. In some embodiments, the voltage altering device 102 can include one or more charge pumps to boost the voltage level of the input voltage 132 and generate the boosted voltage 201. The control device 110 can include drive system 200 to generate drive signals 205 from the boosted voltage 201 and provide the drive signals 205 to the touch screen panel 120. Embodiments of the drive system 200 will be described below in greater detail.

The touch screen panel 120 can include sensor elements, for example, disposed as a two-dimensional matrix, to detect touches on a surface of the touch screen panel 120. The touches on the surface of the touch screen panel 120 can be detection of an object, such as a stylus, finger, palm, cheek, ear, or the like, in contact with or proximate to the touch screen panel 120. In some embodiments, the touch screen panel 120 can include capacitive sensor elements to receive the drive signals 205 from the control device 110 and provide touch signaling 202 back to the control device 110 via the drive system 200. The touch signaling 202 can indicate to the control device 110 whether the surface of the touch screen panel 120 was touched, for example, in contact with or proximate to an object. For example, when the touch screen panel 120 includes capacitive sensor elements, a touch of the surface of the touch screen panel 120 can alter a capacitance associated with the capacitive sensor elements associated with the touch. The drive signals 205 can provide a voltage to one node of the capacitive sensor elements, while the other node corresponds to the touch signaling 202 provided to the control device 110.

The drive system 200 can receive the touch signaling 202 from the touch screen panel 120 and forward the touch signaling 202 as detection signals 204 to a touch detection device 104 in the control device 110. The touch detection device 104 can analyze the detection signals 204 to determine whether a portion of the touch screen panel 120 had been touched, for example, by a user or an object. In some embodiments, the touch detection device 104 can measure the capacitance associated with the capacitive sensor elements from the touch signaling 202 in various ways, such as current versus voltage phase shift measurement, resistor-capacitor charge timing, capacitive bridge divider, charge transfer, successive approximation, sigma-delta modulators, charge-accumulation circuits, field effect, mutual capacitance, frequency shift, or other capacitance measurement algorithms.

Figure 2A:
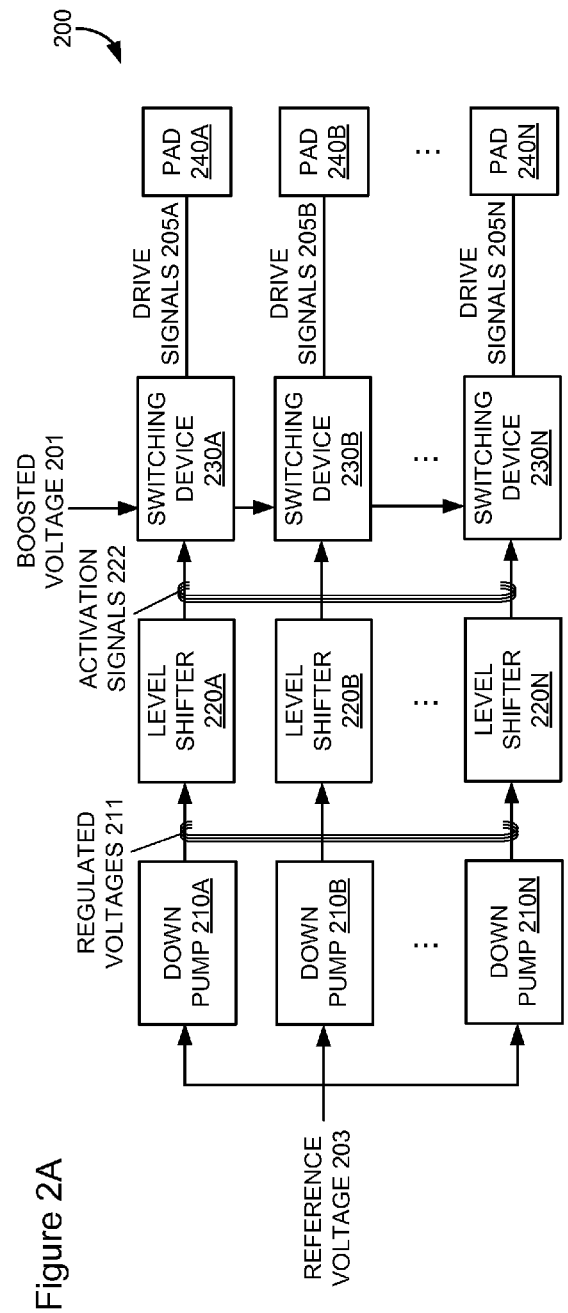

FIGS. 2A-2C are block diagrams illustrating example configurations of the drive system 200. Referring to FIG. 2A, the drive system 200 can include multiple switching devices 230A-230N to generate drive signals 205A-205N from a boosted voltage 201 and provide the drive signals 205A-205N to the touch screen panel 120 via a pad 240. The drive system 200 can include multiple down pumps 210A-210B to generate corresponding regulated voltages 211 based on a reference voltage 203 and the boosted voltage 201 from the voltage altering device 102. The drive system 200 can include multiple level shifters 220A-220B to generate activation signals 222 based, at least in part, on the regulated voltage 211 and the boosted voltage 201. The multiple switching devices 230A-230N can generate the drive signals 205A-205N in response to the activation signals 222. Although FIG. 2A shows the down pumps 210A-210N are located in the drive system 200, in some embodiments, the down pumps 210A-210N can be located in other devices of the control device 110, such as the voltage altering device 102.

Since the switching devices 230A-230N can have a low resistance, for example, approximately 220 ohms, the switching devices 230A-230N can forward the boosted voltage 201 to the touch screen panel 120 via the pads 240A-240N as the drive signals 205A-205N without substantial voltage drops or lost of drive current to the touch screen panel 120. By reducing introduced voltage and current drops, the drive system 200 can increase the signal-to-noise ratio (SNR) of the touch screen panel 120, allowing for more accurate touch detection, and can provide the touch screen panel 120 with reduced response time. As will be discussed below in greater detail, the configuration of the drive system 300 to include a down pumps 210A-210N and level shifters 20A-220N can allow the drive system 300 to receive a variable boosted voltage 201, for example, in a range between 1V-10V, and set activation signals 222 to turn-on the switching devices 230A-230N to generate the drive signals 205A-205N.

Referring to FIG. 2B, shows another example embodiment of the drive system 200 that is similar to the example embodiment shown in FIG. 2A with the following differences. The drive system 200 shown in FIG. 2B includes a single down pump 210 to provide a regulated voltage 211 to multiple level shifters 220A-220N. The level shifters 220A-220N can generate corresponding activation signals 222 based on the regulated voltages 211 and the boosted voltage 201. The switching devices 230A-230N can generate corresponding drive signals 205A-205N in response to the activation signals 222. Although FIG. 2B shows the down pump 210 is located in the drive system 200, in some embodiments, the down pump 210 can be located in other devices of the control device 110, such as the voltage altering device 102.

Referring to FIG. 2C, shows another example embodiment of the drive system 200 that is similar to the example embodiment shown in FIG. 2A with the following differences. The drive system 200 shown in FIG. 2C includes a multiple down pumps 210A-210N to provide a regulated voltage 211 to a single level shifter 220. The level shifter 220 can generate the activation signal 222 based on the regulated voltage 211 and the boosted voltage 201. The switching device 230 can generate drive signals 205 in response to the activation signal 222. Although FIG. 2C shows the down pumps 210A-210N are located in the drive system 200, in some embodiments, the down pumps 210A-210N can be located in other devices of the control device 110, such as the voltage altering device 102.

Figure 3:
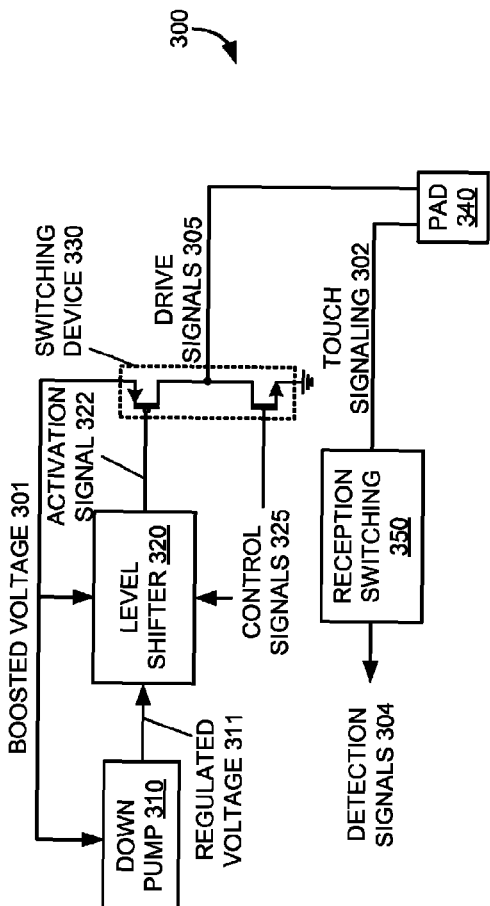
FIG. 3 is a block diagram example of at least a portion of a drive system.

FIG. 3 is a block diagram example of at least a portion of a drive system 300. Referring to FIG. 3, the drive system 300 can include a switching device 330 to generate drive signals 305 based, at least in part, on the boosted voltage 301 from the voltage altering device 102 and in response to an activation signal 322. The switching device 330 can provide the drive signals 305 to the touch screen panel 120 via a pad 340.

In some embodiments, the switching device 330 can include a p-type field effect transistor (PFET) device to receive the boosted voltage 301 at a source region, receive the activation signal 322 at a gate region, and a drain region to output the drive signals 305 at the drain region. The switching device 330 also can include an n-type field effect transistor (NFET) device having a drain region coupled to the drain region of the PFET, a source region coupled to a ground or low voltage supply, and a gate region coupled to receive control signals 325.

The drive system 300 can include a down pump 310 to generate a regulated voltage 311 based on a reference voltage 303 and the boosted voltage 301 from the voltage altering device 102. In some embodiments, the reference voltage 303 can have a predetermined voltage level that corresponds to a voltage level capable of activating or turning-on the switching device 330 to generate drive signals 305. The regulated voltage 311 can have a voltage level that corresponds to a difference between voltage levels of the boosted voltage 301 and the reference voltage 303. For example, when the voltage level of the boosted voltage 301 is 10 volts and the voltage level of the reference voltage is 5 volts, the voltage level of the regulated voltage 311 can be 5 volts, allowing operation of a PFET device with a 5V gate-source voltage capability and a 10V drain-source voltage capability.

The drive system 300 can include a level shifter 320 to generate the activation signal 322 based, at least in part, on the regulated voltage 311 and the boosted voltage 301. The level shifter 320 can set the voltage level of activation signal 322 based on control signals 325, for example, received from other circuitry in the control device 110 or from a device external to the control device 110. In some embodiments, the level shifter 320 can set the voltage level of activation signal 322 to a first voltage level, for example, that is capable of turning-on the PFET in the switching device 330, or to a second voltage level, for example, that is that is capable of turning-off the PFET in the switching device 330. The first voltage level can correspond to a difference between the voltage levels of the boosted voltage 301 and the regulated voltage 311, such as the voltage level of the reference voltage 303, which can turn-on the PFET in the switching device 330. The second voltage level can correspond to a low voltage level as compared to the first voltage level, such as the levels of the boosted voltage, which can turn-off the PFET in the switching device 330.

Since the switching device 330 can have a low resistance, for example, approximately 220 ohms, the switching device 330 can forward the boosted voltage 301 to the touch screen panel 120 via the pad 340 as the drive signals 305 without substantial voltage drops or limitation of drive current to the touch screen panel 120. By reducing introduced voltage and current drops, the drive system 300 can increase the signal-to-noise ratio (SNR) of the touch screen panel 120, allowing for more accurate touch detection, and can provide the touch screen panel 120 with reduced response time, allowing the touchscreen panel to be driven faster.

Figure 4:
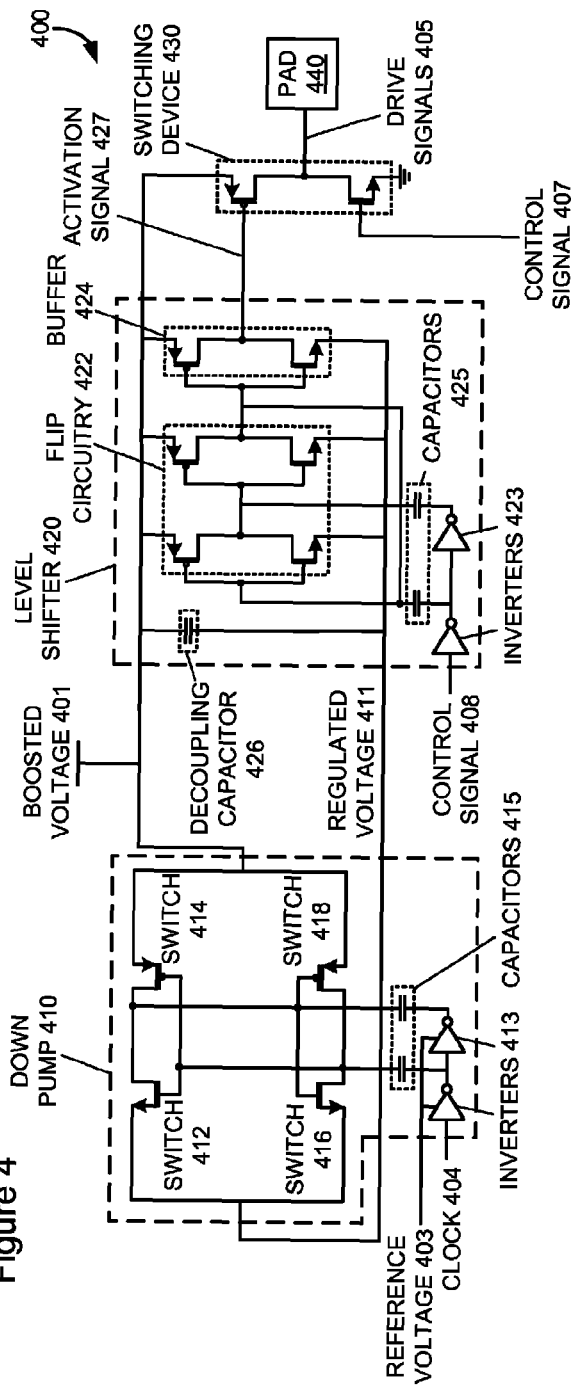
FIG. 4 is a block diagram illustrating another example of at least a portion of the drive system.

FIG. 4 is a block diagram illustrating another example of at least a portion of a drive system 400. Referring to FIG. 4, the drive system 400 includes a down pump 410 to generate a regulated voltage 411 from a boosted voltage 401 and a reference voltage 403. In some embodiments, the reference voltage 403 can have a predetermined voltage level that corresponds to a voltage level capable of activating or turning-on the switching device 430 to generate drive signals 405. The regulated voltage 411 can have a voltage level that corresponds to a difference between voltage levels of the boosted voltage 401 and the reference voltage 403.

The down pump 410 can include switches 412 and 416, for example, n-type metal-oxide-semiconductor (NMOS) transistors, with their respective gates and drains tied to switches 414 and 418, for example, p-type metal-oxide-semiconductor (PMOS) transistors. The switches 414 and 418 can have their sources tied to a boosted voltage 401 and the switches 406 and 408 can have their sources tied to a regulated voltage 411.

The gates of switches 412 and 414 can be tied to drains of switches 416 and 418 and to a first node of a first one of the capacitors 415. A second node of the first one of the capacitors 415 can receive a clock 404 inverted by one of the inverters 413. The gates of switches 416 and 418 can be tied to drains of switches 412 and 414 and to a first node of a second one of the capacitors 415. A second node of the second one of the capacitors 415 can receive the clock 404 twice inverted by the inverters 413.

The drive system 400 can include a level shifter 420 to generate an activation signal 427 from the boosted voltage 401 and the regulated voltage 411. The level shifter 420 can generate the activation signal 427 in response to a control signal 408. In some embodiments, the level shifter 420 can set the voltage level of the activation signal 427 to a first voltage level, for example, that is capable of turning-on a PFET in the switching device 430, or to a second voltage level, for example, that is capable of turning-off the PFET in the switching device 430. The first voltage level can correspond to a difference between the voltage levels of the boosted voltage 401 and the regulated voltage 411, such as the voltage level of the reference voltage 403. The second voltage level can correspond to a low voltage level as compared to the first voltage level, such as a ground voltage level.

The level shifter 420 can include flip circuitry 422 to generate the activation signal 427. In some embodiments, the flip circuitry 422 includes a pair of complementary metal-oxide-semiconductor (CMOS) inverters arranged in a closed loop configuration. For example, each CMOS inverter can include a p-type metal-oxide-semiconductor (PMOS) transistor with its gate and drain tied to an n-type metal-oxide-semiconductor (NMOS) transistor. The input of a first CMOS inverter, or the gates of the PMOS transistor and NMOS transistor, can receive an inverted control signal 408 via one of the capacitors 425 and inverters 423, while the output of the first CMOS inverter can be coupled to the input of a second CMOS inverter and a non-inverted control signal 408 via one of the capacitors 425 and inverters 423. The sources of the PMOS transistors in the CMOS inverters can receive the boosted voltage 401 and the sources of the NMOS transistors in the CMOS inverters can receive the regulated voltage 411.

The level shifter 420 can optionally include a buffer 424 to output the activation signal 427 to the switching device 430. The buffer 424 can include a CMOS inverter similar to one of the inverters in the flip circuitry 422. The buffer 424 can have an input coupled to the output of the second CMOS inverter in the flip circuitry 422 and an inverted control signal 408 via one of the capacitors 425 and inverters 423, a source of a PMOS transistor coupled to receive the boosted voltage 401, and a source of an NMOS transistor to receive the regulated voltage 411.

In some embodiments, level shifter 420 includes the buffer 424 to reduce a potential shoot-through current to the switching device 430. In order to provide a quick response to a change in the control signal 408, in some embodiments, the flip circuitry 422 can be implemented with CMOS circuitry having a small transistor sizing, while the buffer 424 can have CMOS circuitry having a large transistor sizing to reduce potential shoot-through current to the switching device 430. The flip circuitry 422 can react quickly to changes in the control signal 408 due to its transistor sizing, while the buffer 424 can provide the activation signal 427 to the switching device 430 with less shoot-through current than when directly provided from the flip circuitry 422 by driving the gate faster.

The level shifter 420 can include a decoupling capacitor 426 coupled in parallel to the inverters in the flip circuitry 422 and the buffer 424. The decoupling capacitor 426 can receive the boosted voltage 401 at a first node and receive the regulated voltage 411 at a second node. The decoupling capacitor 426 can smooth out any voltage fluctuations corresponding to the boosted voltage 401 that may be caused by a transition in the flip circuitry 422 in response to a change in the control signal 408. Although FIG. 4 shows the decoupling capacitor 426 as being included in the level shifter 420, in some embodiments, the decoupling capacitor 426 can be located separate from the level shifter 420 or in the down pump 410.

FIG. 5 is a block diagram illustrating another example of down pump for the drive system 400 shown in FIG. 4. Referring to FIG. 5, a down pump cell 500 can include the similar structure as down pump 410 with switches 502, 504, 506, and 508 and capacitors 511 and 513 corresponding to the switches 412-418 and capacitors 415, but also include additional switches 512, 514, 516, 518, 522, 524, 526, and 528. In some embodiments, the switches 512, 514, 516, and 518 can be p-type metal-oxide-semiconductor (PMOS) transistors, and switches 522, 524, 526, and 528 can be n-type metal-oxide-semiconductor (NMOS) transistors.

The switches 512 and 516 can have their sources coupled to boosted voltage 515. The switches 514 and 518 can have their sources coupled to the drains of switches 512 and 514, respectively. The switches 522 and 526 can have their drains coupled to the drains of switches 514 and 518, respectively. The switches 524 and 528 can have their drains coupled to the sources of switches 522 and 526, respectively. The switches 512, 518, 524, and 526 can have their gates coupled to the gates of switches 504 and 508. The switches 514, 516, 522, and 528 can have their gates coupled to the gates of switches 502 and 506. The switches 512 and 514 can operate a back gate of the switch 502, the switches 522 and 524 operate a back gate of the switch 506, the switches 516 and 518 operate a backgate of the switch 504, switches 526 and 528 operate a backgate of the switch 508.

Figures 6A, 6B:
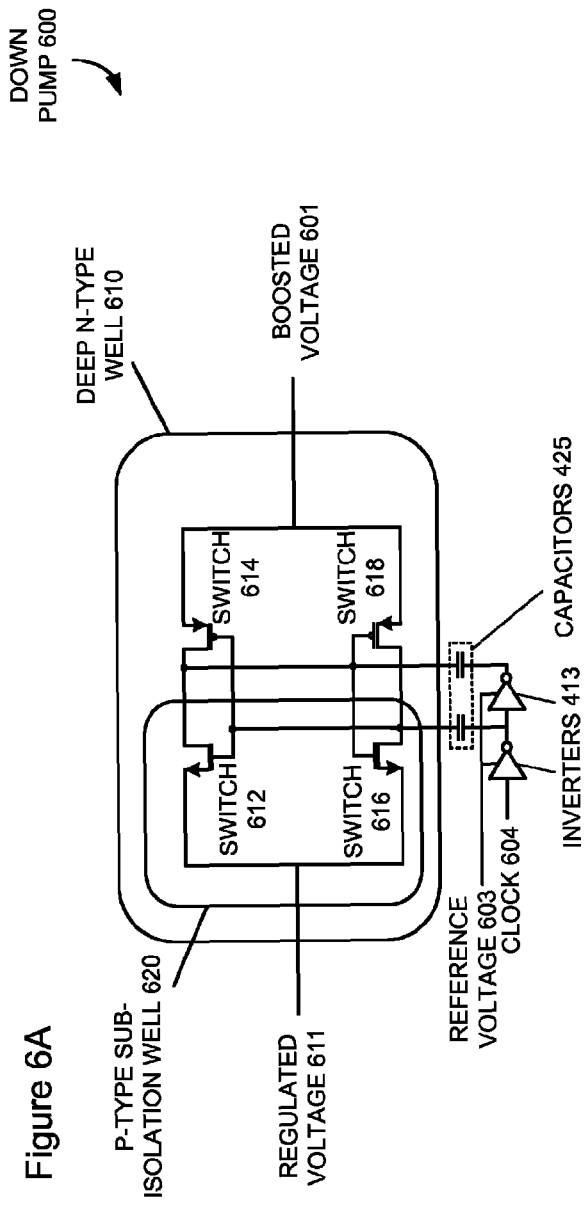
FIGS. 6A-6B and 7A-7B are block diagrams illustrating example triple well implementations of the drive system.

FIGS. 6A-6B and 7A-7B are block diagrams illustrating example triple well implementations of a drive system. Referring to FIG. 6A and 6B, the drive system can include a down pump 600 fabricated in a triple-well or an oxide-trench isolated-well. The triple-well or oxide-trench isolated-well can include a p-type semiconductor substrate 630 having a top surface including a deep n-type well 610 and a p-type sub-isolation well 620 formed in the deep n-type well 610. NMOS switches 612 and 616 can be formed in the p-type sub-isolation well 620 and the PMOS switches 614 and 616 can be formed in the deep n-type well 610.

The p-type sub-isolation well 620 and the deep n-type well 610 can electrically isolate the switches 612-618 in the down pump 600 from other circuitry formed on the substrate 630, such as circuitry in the control device 110. This electrical isolation can allow the down pump 600 to generate a regulated voltage 611 having a negative voltage level from a boosted voltage 601 without adversely affecting other circuitry on the substrate.

Figure 7A:
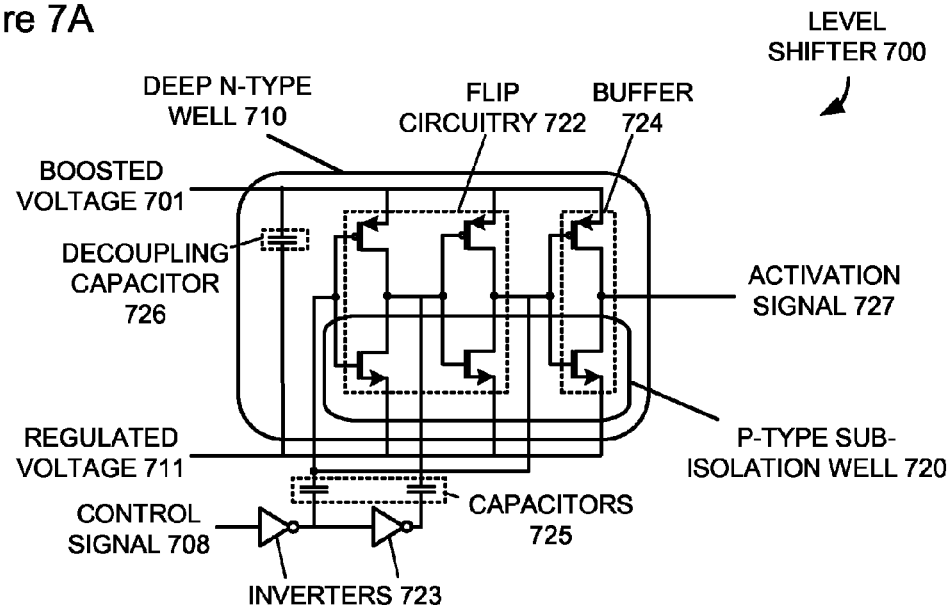
Figure 7B:
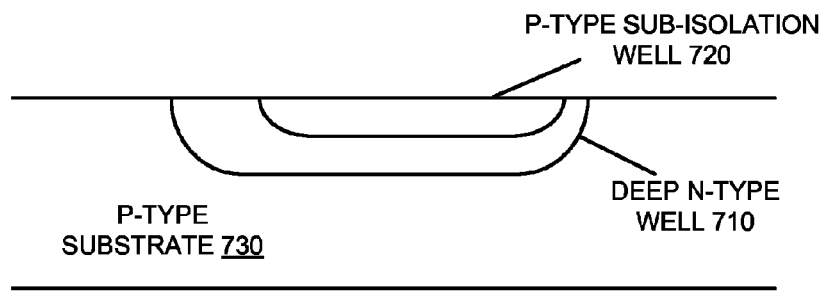

Referring to FIGS. 7A and 7B, the drive system can include a level shifter 700 fabricated in a triple-well or an oxide-trench isolated-well. The triple-well or oxide-trench isolated-well can include a p-type semiconductor substrate 730 having a top surface including a deep n-type well 710 and a p-type sub-isolation well 720 formed in the deep n-type well 610. The NMOS switches of the level shifter 700, such as those in the flip circuitry 722 and buffer 724, can be formed in the p-type sub-isolation well 720, while the PMOS switches of the level shifter 700, such as those in the flip circuitry 722 and buffer 724, can be formed in the deep n-type well 710.

The p-type sub-isolation well 720 and the deep n-type well 710 can electrically isolate the CMOS switches of the level shifter 700 from other circuitry formed on the substrate 730, such as circuitry in the control device 110. This electrical isolation can allow the level shifter 700 to receive a regulated voltage 711 having a negative voltage level from a down pump without adversely affecting other circuitry on the substrate.

Referring to FIG. 6A-6B and 7A-7B, in an example, when the boosted voltage 601 or 701 has a voltage level corresponding to 1V and a reference voltage 603 has a voltage level corresponding to 5V, the down pump 600 can generate a regulated voltage 611 or 711 having a voltage level corresponding to −4V. The level shifter 700 can receive the regulated voltage 611 or 711 from the down pump 600 and generate an activation signal 727 having a voltage level corresponding to 5V based on the 1V boosted voltage 601 or 701 and −4V regulated voltage 611 or 711. By electrically isolating the down pump 600 and the level shifter 700, the drive system can provide an activation signal 727 to a switching device in the drive system that is substantially constant even when the boosted voltage 601 or 701 has a voltage level lower than a voltage level capable of turning-on the switching device. The drive system can therefore receive boosted voltages 601 or 701 over a range of voltage levels and be able to provide an activation signal 727 capable of turning on to the switching device with a relatively constant voltage level.

Figure 8:
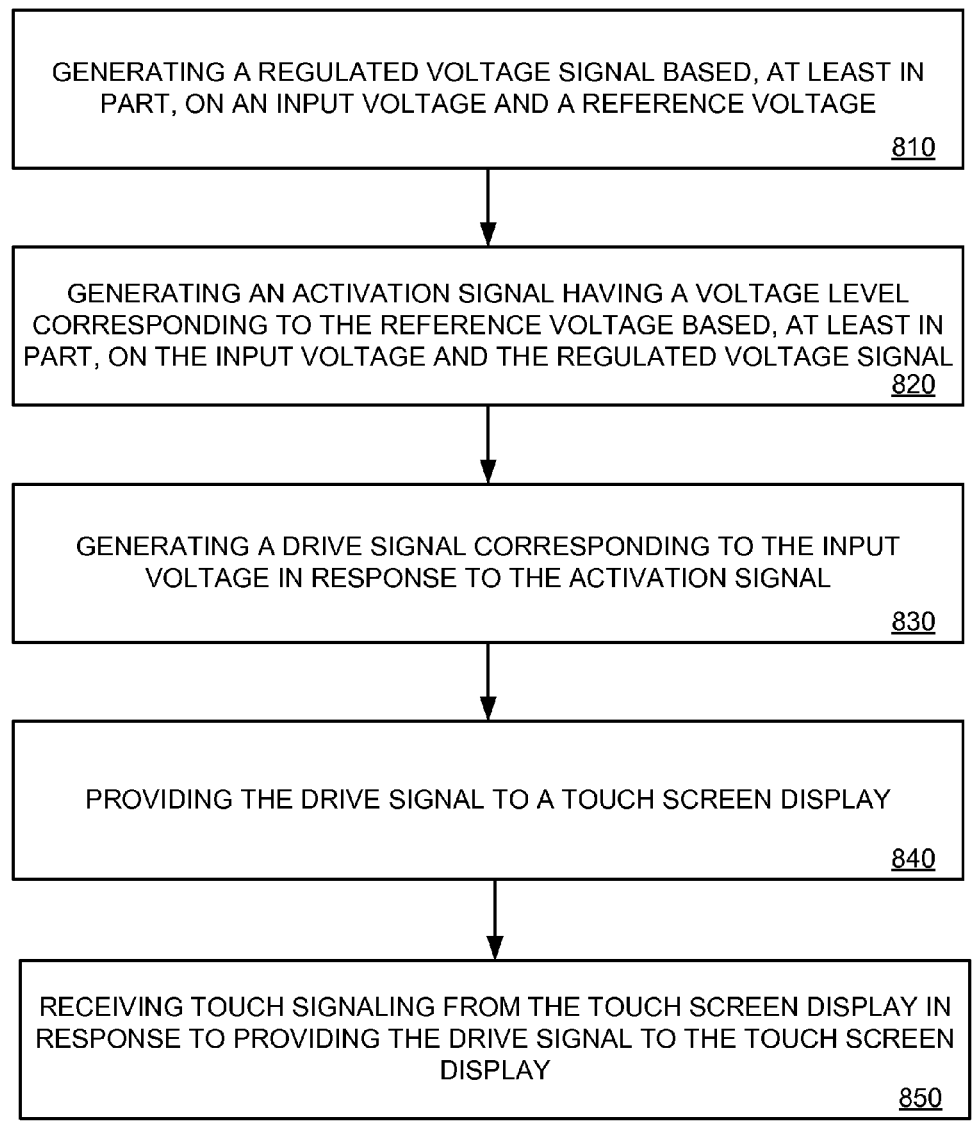
FIG. 8 is an example operational flowchart for the operation of the drive system.

FIG. 8 is an example operational flowchart for the operation of the drive system. Referring to FIG. 8, in a block 810, a drive system can generate a regulated voltage signal based, at least in part, on an input voltage and a reference voltage. The regulated voltage signal can have a voltage level corresponding to a difference between the input voltage and the reference voltage. In some embodiments, the drive system can include a down pump to generate the regulated voltage signal by reducing a voltage level of the input voltage by a magnitude corresponding to a voltage level of the reference voltage.

In a block 820, the drive system can generate an activation signal having a voltage level corresponding to the reference voltage based, at least in part, on the input voltage and the regulated voltage signal. In some embodiments, the drive system can include a level shifter to generate the activation signal having a voltage level corresponding to a difference in voltage level between the input voltage and the regulated voltage signal.

In a block 830, the drive system can generate a drive signal corresponding to the input voltage in response to the activation signal. In some embodiments, the drive system can include a switching device, such as a PFET, to output the input signal as the drive signal in response to the activation signal.

In a block 840, the drive system can provide the drive signal to a touch screen display. The drive system can include a pad to receive the drive signal from the switching device and output the drive signal to the touch screen display. The current associated with the drive signal can correspond to a temporal response of the touch screen display. Since the drive system can utilize a PFET switching, the drive system has a low resistance path to forward the input voltage as the drive signal, thus allowing the drive signal to avoid large voltage drops or current reductions.

In a block 850, the drive system can receive touch signaling from the touch screen display in response to providing the drive signal to the touch screen display. In some embodiments, the pad can receive the touch signaling from the touch screen display. In this mode, the switching devices in the drive system can be turned-off so as not to interfere with the incoming signal from the touch screen panel. A magnitude of the touch signaling can correspond to a voltage level of the drive signal and indicate whether an object has touched the touch screen display.

The system and apparatus described above may use dedicated processor systems, micro controllers, programmable logic devices, microprocessors, or any combination thereof, to perform some or all of the operations described herein. Some of the operations described above may be implemented in software and other operations may be implemented in hardware. Any of the operations, processes, and/or methods described herein may be performed by an apparatus, a device, and/or a system substantially similar to those as described herein and with reference to the illustrated figures.

The processing device may execute instructions or "code" stored in memory. The memory may store data as well. The processing device may include, but may not be limited to, an analog processor, a digital processor, a microprocessor, a multi-core processor, a processor array, a network processor, or the like. The processing device may be part of an integrated control system or system manager, or may be provided as a portable electronic device configured to interface with a networked system either locally or remotely via wireless transmission.

The processor memory may be integrated together with the processing device, for example RAM or FLASH memory disposed within an integrated circuit microprocessor or the like. In other examples, the memory may comprise an independent device, such as an external disk drive, a storage array, a portable FLASH key fob, or the like. The memory and processing device may be operatively coupled together, or in communication with each other, for example by an I/O port, a network connection, or the like, and the processing device may read a file stored on the memory. Associated memory may be "read only" by design (ROM) by virtue of permission settings, or not. Other examples of memory may include, but may not be limited to, WORM, EPROM, EEPROM, FLASH, or the like, which may be implemented in solid state semiconductor devices. Other memories may comprise moving parts, such as a known rotating disk drive. All such memories may be "machine-readable" and may be readable by a processing device.

Operating instructions or commands may be implemented or embodied in tangible forms of stored computer software (also known as "computer program" or "code"). Programs, or code, may be stored in a digital memory and may be read by the processing device. "Computer-readable storage medium" (or alternatively, "machine-readable storage medium") may include all of the foregoing types of memory, as well as new technologies of the future, as long as the memory may be capable of storing digital information in the nature of a computer program or other data, at least temporarily, and as long at the stored information may be "read" by an appropriate processing device. The term "computer-readable" may not be limited to the historical usage of "computer" to imply a complete mainframe, mini-computer, desktop or even laptop computer. Rather, "computer-readable" may comprise storage medium that may be readable by a processor, a processing device, or any computing system. Such media may be any available media that may be locally and/or remotely accessible by a computer or a processor, and may include volatile and non-volatile media, and removable and non-removable media, or any combination thereof.

A program stored in a computer-readable storage medium may comprise a computer program product. For example, a storage medium may be used as a convenient means to store or transport a computer program. For the sake of convenience, the operations may be described as various interconnected or coupled functional blocks or diagrams. However, there may be cases where these functional blocks or diagrams may be equivalently aggregated into a single logic device, program or operation with unclear boundaries.

One of skill in the art will recognize that the concepts taught herein can be tailored to a particular application in many other ways. In particular, those skilled in the art will recognize that the illustrated examples are but one of many alternative implementations that will become apparent upon reading this disclosure.

Although the specification may refer to "an", "one", "another", or "some" example(s) in several locations, this does not necessarily mean that each such reference is to the same example(s), or that the feature only applies to a single example.

The invention claimed is:

1. An touch panel apparatus comprising:
   a down pump configured to generate a regulated voltage signal based, at least in part, on an input voltage and a reference voltage;
   a level shifter configured to generate an activation signal having a voltage level corresponding to the reference voltage based, at least in part, on the input voltage and the regulated voltage signal; and
   a switching device configured to generate a drive signal corresponding to the input voltage in response to the activation signal.

2. The touch panel apparatus of claim 1, wherein the regulated voltage signal has a voltage level corresponding to a difference between the input voltage and the reference voltage.

3. The touch panel apparatus of claim 1, wherein the down pump and the level shifter are formed in a triple-well to electrically isolate the down pump and the level shifter from other circuitry in the touch panel apparatus, wherein the down pump is configured to generate the regulated voltage signal having a negative voltage level.

4. The touch panel apparatus of claim 1, wherein the level shifter further comprising flip circuitry including multiple inverters arranged in a closed loop configuration, wherein the flip circuitry is configured to generate the activation signal in response to a control signal.

5. The touch panel apparatus of claim 4, further comprising a decoupling capacitor coupled between the input voltage and the regulated voltage signal, and configured to reduce fluctuation in the input voltage introduced by the flip circuitry during the generation of the activation signal.

6. The touch panel apparatus of claim 4, wherein the level shifter further comprising a buffer coupled to the flip circuitry and configured to provide the activation signal to the switching device in response to the control signal.

7. The touch panel apparatus of claim 1, wherein the switching device includes a p-type field effect transistor (PFET) device configured to generate the drive signal at a drain region from the input voltage at a source region and the activation signal at a gate region.

8. A method of driving a touch panel comprising:
   generating, with a drive system, a regulated voltage signal based, at least in part, on an input voltage and a reference voltage;
   generating, with the drive system, an activation signal having a voltage level corresponding to the reference voltage based, at least in part, on the input voltage and the regulated voltage signal; and
   generating, with the drive system, a drive signal corresponding to the input voltage in response to the activation signal.

9. The method of driving a touch panel of claim 8, wherein the regulated voltage signal has a voltage level corresponding to a difference between the input voltage and the reference voltage.

10. The method of driving a touch panel of claim 8, further comprising providing the drive signal to a touch screen display.

11. The method of driving a touch panel of claim 10, further comprising receiving touch signaling from the touch screen display in response to providing the drive signal to the touch screen display.

12. The method of driving a touch panel of claim 11, further comprising forwarding the touch signaling to a touch detection device configured to identify whether an object is proximate to the touch screen display based on the touch signaling.

13. The method of driving a touch panel of claim 8, wherein the drive system is formed in an oxide-trench isolated-well to electrically isolate the drive system from other circuitry in a common die, wherein the drive system is configured to generate the regulated voltage signal having a negative voltage level.

14. The method of driving a touch panel of claim 8, wherein the drive system includes a p-type field effect transistor (PFET) device configured to generate the drive signal at a drain region from the input voltage at a source region and the activation signal at a gate region.

15. An touch panel apparatus comprising:
   a charge pump device configured to boost a voltage level of an input signal; a drive system configured to generate an activation signal based on the boosted input signal,
   wherein the drive system includes a switching device configured to generate a drive signal corresponding to the boosted input signal in response to the activation signal; and
   a touch screen display configured to sense an object is proximate to a panel of the touch screen display in response to the drive signal.

16. The touch panel apparatus of claim 15, further comprising a down pump configured to generate a regulated voltage signal based, at least in part, on the boosted input signal and a reference voltage, wherein the drive system is configured to generate the activation signal based, at least in part, on the boosted input signal and the regulated voltage signal.

17. The touch panel apparatus of claim 16, wherein the activation signal has a voltage level corresponding to the reference voltage.

18. The touch panel apparatus of claim 16, wherein the drive system further comprising:
   a first level shifter configured to generate a first activation signal based, at least in part, on the boosted input signal and the regulated voltage signal; and
   a first switching device configured to generate a first drive signal corresponding to the boosted input signal in response to the first activation signal.

19. The touch panel apparatus of claim 18, wherein the drive system further comprising:
   a second level shifter configured to generate a second activation signal based, at least in part, on the boosted input signal and the regulated voltage signal; and
   a second switching device configured to generate a second drive signal corresponding to the boosted input signal in response to the second activation signal.

20. The touch panel apparatus of claim 16, wherein the drive system is configured to include the down pump.

* * * * *